United States Patent
Yang et al.

(10) Patent No.: US 11,806,836 B2
(45) Date of Patent: Nov. 7, 2023

(54) CALCIUM CARBONATE SLURRY

(71) Applicant: Illumina, Inc., San Diego, CA (US)

(72) Inventors: Robert Yang, San Diego, CA (US); Samantha K. Brittelle, San Diego, CA (US); You-Jung Cheng, San Diego, CA (US); Scott William Bailey, San Diego, CA (US); James M. Tsay, San Diego, CA (US)

(73) Assignee: Illumina, Inc., San Diego, CA (US)

( * ) Notice: Subject to any disclaimer, the term of this patent is extended or adjusted under 35 U.S.C. 154(b) by 0 days.

(21) Appl. No.: 17/543,642

(22) Filed: Dec. 6, 2021

(65) Prior Publication Data

US 2022/0089910 A1 Mar. 24, 2022

Related U.S. Application Data

(62) Division of application No. 16/488,140, filed as application No. PCT/US2018/019019 on Feb. 21, 2018, now Pat. No. 11,214,712.

(Continued)

(51) Int. Cl.
| | | |
|---|---|---|
| *B24C 1/08* | (2006.01) | |
| *C09G 1/02* | (2006.01) | |
| *C09K 3/14* | (2006.01) | |
| *C09G 1/00* | (2006.01) | |
| *C09G 1/04* | (2006.01) | |

(Continued)

(52) U.S. Cl.
CPC .................. *B24C 1/08* (2013.01); *B24B 1/00* (2013.01); *B24B 37/044* (2013.01); *C09G 1/00* (2013.01); *C09G 1/02* (2013.01); *C09G 1/04* (2013.01); *C09G 1/06* (2013.01); *C09K 3/1409* (2013.01); *C09K 3/1454* (2013.01);

(Continued)

(58) Field of Classification Search
None
See application file for complete search history.

(56) References Cited

U.S. PATENT DOCUMENTS

| | | |
|---|---|---|
| 3,245,819 A | 4/1966 | Eberts |
| 4,049,586 A | 9/1977 | Collier |

(Continued)

FOREIGN PATENT DOCUMENTS

| | | |
|---|---|---|
| CN | 101535183 A | 9/2009 |
| CN | 101570343 A | 11/2009 |

(Continued)

OTHER PUBLICATIONS

Seo et al., "Preparation and characterization of slurry for chemical mechanical planarization", in Advances in Chemical Mechanical Planarization, edited by S. Babu, Elsevier, pp. 284-286). (Year: 2016).*

(Continued)

*Primary Examiner* — Jiong-Ping Lu
(74) *Attorney, Agent, or Firm* — Dierker & Kavanaugh, P.C.

(57) ABSTRACT

A composition is provided that comprises a calcium carbonate slurry. The calcium carbonate slurry comprises a plurality of calcium carbonate particles suspended in a solution, where the solution comprises a dispersant and an anionic surfactant. The concentration of the calcium carbonate particles in the calcium carbonate slurry is equal to or less than about 2.0 wt. %.

9 Claims, 12 Drawing Sheets

Related U.S. Application Data

(60) Provisional application No. 62/463,533, filed on Feb. 24, 2017.

(51) Int. Cl.
| | |
|---|---|
| *C09G 1/06* | (2006.01) |
| *C09K 13/06* | (2006.01) |
| *B24B 1/00* | (2006.01) |
| *B24B 37/04* | (2012.01) |
| *H01L 21/321* | (2006.01) |
| *H01L 21/306* | (2006.01) |

(52) U.S. Cl.
CPC ............ *C09K 3/1463* (2013.01); *C09K 13/06* (2013.01); *H01L 21/30625* (2013.01); *H01L 21/3212* (2013.01)

(56) References Cited

U.S. PATENT DOCUMENTS

| | | | |
|---|---|---|---|
| 4,758,377 A | | 7/1988 | Iding et al. |
| 5,032,203 A | * | 7/1991 | Doy ................ B24B 37/04 438/692 |
| 5,279,755 A | | 1/1994 | Choy et al. |
| 5,880,177 A | | 3/1999 | Higgs et al. |
| 5,958,288 A | | 9/1999 | Mueller et al. |
| 6,123,855 A | | 9/2000 | Hansen et al. |
| 6,294,105 B1 | | 9/2001 | Feeney et al. |
| 6,783,434 B1 | | 8/2004 | Akahori et al. |
| 9,074,067 B2 | | 7/2015 | Dufour |
| 2014/0345496 A1 | | 11/2014 | Dufour |
| 2015/0005447 A1 | | 1/2015 | Berti et al. |
| 2017/0355880 A1 | * | 12/2017 | Smith ................ C09G 1/02 |

FOREIGN PATENT DOCUMENTS

| | | |
|---|---|---|
| CN | 104087246 A | 10/2014 |
| CN | 104131297 A | 11/2014 |
| CN | 105431554 A | 3/2016 |
| CN | 106046860 A | 10/2016 |
| CN | 106318220 A | 1/2017 |
| EP | 0811654 A1 | 12/1997 |
| EP | 1022326 A1 | 7/2000 |
| JP | 2926408 B2 | 7/1999 |
| JP | 2000328045 A | 11/2000 |
| JP | 2016069552 A | 5/2016 |
| KR | 20030037676 A | 5/2003 |
| WO | 1997011484 A1 | 3/1997 |
| WO | 2006022849 A1 | 3/2006 |
| WO | 2009040597 A1 | 4/2009 |
| WO | 2015002813 A1 | 1/2015 |
| WO | 2015164949 A1 | 11/2015 |
| WO | 2016113285 A1 | 7/2016 |
| WO | 2016126458 A1 | 8/2016 |

OTHER PUBLICATIONS

R. Masalek "Particle Size and Zeta Potential of ZnO, APCBEE", Procedia, vol. 9, pp. 13-17, 2014.

LI Jing "Research of Silicon Wafer Grinding Fluid", Exclusive Equipment for Electronics Industry, vol. 1, pp. 26-27, 42, Feb. 20, 2017.

ISA "International Search Report and Written Opinion, PCT/US2018/019019", 13 pages, dated Jun. 1, 2018.

* cited by examiner

1200

```
Method of polishing a surface of a substrate
```

1210

Mix a plurality of calcium carbonate particles in a solution including a dispersant and an anionic surfactant using one or more of a magnetic stir bar, impeller type mixer, diaphragm pump, slurry pump, peristaltic pump, and high pressure pump to form a calcium carbonate slurry

1220

Polish a surface of a substrate with the calcium carbonate slurry, where the substrate is coated with a soft material, where the calcium carbonate slurry comprises the dispersant, the anionic surfactant, and the plurality of calcium carbonate particles suspended in solution

Method of manufacturing a calcium carbonate slurry

↓ 1310

Mix a dispersant and an anionic surfactant into a solution

↓ 1320

Add a plurality of calcium carbonate particles suspended in the solution to form a slurry, where a concentration of the calcium carbonate particles in the slurry is equal to or less than about 2.0 wt.%

↓ 1330

Mix the plurality of calcium carbonate particles over time to maintain suspension of the calcium carbonate particles in the solution

*FIGURE 13*

CALCIUM CARBONATE SLURRY

CROSS-REFERENCE TO RELATED APPLICATIONS

This application is a division of U.S. Application Ser. No. 16/488,140, filed Aug. 22, 2019, which itself is a 35 U.S.C. § 371 National Stage application of International Patent Application No. PCT/US2018/019019, filed on Feb. 21, 2018, which claims the benefit of priority under 35 U.S.C. § 119(e) to U.S. Provisional Patent Application Ser. No. 62/463,533, filed Feb. 24, 2017, and titled "CALCIUM CARBONATE SLURRY," each of which is hereby incorporated by reference herein in its entirety and for all purposes.

BACKGROUND

In the semiconductor industry, many different commercialized slurries exist for chemical mechanical polishing (CMP) of substrates, including silica and ceria polishing slurries. These commercialized slurries may be useful in polishing oxide films and metals on a substrate, but they may be undesirable in polishing soft materials, including polymer films such as polymeric hydrogels, that may be easily susceptible to scratching. Substrates may be coated with soft materials and may include nanoscale features. For example, a glass substrate coated with a soft material may be used in gene sequencer systems as well as in other biological or chemical analysis systems.

To avoid or minimize scratching of soft materials, solutions without particles have been used for polishing soft materials. For instance, a particle-free solution containing water and sodium dodecyl sulfate (SDS) has been used to polish soft materials. However, such processes may be difficult to precisely control, often involving a long run time and/or a high pressure that contributes to substrate breakage and strain on the polisher.

SUMMARY

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale unless specifically indicated as being scaled drawings.

In some implementations, a composition is provided. The composition includes a calcium carbonate slurry comprising a plurality of calcium carbonate particles suspended in a solution, where the solution comprises a dispersant and an anionic surfactant, and a concentration of the calcium carbonate particles in the calcium carbonate slurry is equal to or less than about 2.0 wt. %. In some implementations, one or both of the dispersant and the anionic surfactant reduces a zeta potential of the slurry. In some implementations, a zeta potential of the slurry is equal to or less than about −50 mV. In some implementations, the dispersant includes sodium polyacrylate, sodium n-silicate, sodium tetrapyrophosphate, sodium hexametaphosphate, sodium polyaluminate, sodium tetraborate, sodium triphosphate, sodium citrate, or combinations thereof. In some implementations, the anionic surfactant includes sodium dodecyl sulfate (SDS), polysorbate, octylphenol ethoxylate, or combinations thereof. In some implementations, an average diameter of the plurality of calcium carbonate particles is between about between about 10 nm and about 3 μm. In some implementations, less than about 5% of a total number of the calcium carbonate particles has a diameter greater than about 4 μm.

In some implementations, a method is provided. The method includes polishing a surface of a substrate with a calcium carbonate slurry, where the substrate is coated with a soft material, where the calcium carbonate slurry comprises a dispersant, an anionic surfactant, and a plurality of calcium carbonate particles suspended in a solution. In some implementations, a concentration of the calcium carbonate particles in the calcium carbonate slurry is equal to or less than about 2.0 wt. %. In some implementations, the soft material includes an organic polymeric hydrogel. In some implementations, the method further includes mixing, prior to polishing the substrate, the plurality of calcium carbonate particles in the solution with the dispersant and the anionic surfactant using one or more of a magnetic stir bar, impeller type mixer, diaphragm pump, slurry pump, peristaltic pump, and high pressure pump. In some implementations, the substrate includes a plurality of features, each of the features having a diameter between about 1 nm and about 100 nm. In some implementations, polishing the surface of the substrate coated with the soft material occurs without substantially scratching the surface of the substrate. In some implementations, one or both of the dispersant and the anionic surfactant reduces a zeta potential of the slurry. In some implementations, a zeta potential of the slurry is equal to or less than −50 mV.

In some implementations, a method is provided. The method includes mixing a dispersant and an anionic surfactant into a solution and adding a plurality of calcium carbonate particles suspended in the solution to form a slurry, where a concentration of the calcium carbonate particles in the slurry is less than about 2.0 wt. %. In some implementations, the method further includes mixing the plurality of calcium carbonate particles over time to maintain suspension of the calcium carbonate particles in the solution.

These and other implementations are described in further detail with reference to the Figures and the detailed description below.

BRIEF DESCRIPTION OF THE DRAWINGS

The various implementations disclosed herein are illustrated by way of example, and not by way of limitation, in the figures of the accompanying drawings, in which like reference numerals refer to similar elements.

FIG. 12 shows a flow diagram illustrating an example method for polishing a surface of a substrate.

FIG. 13 shows a flow diagram illustrating an example method for manufacturing a calcium carbonate slurry.

DETAILED DESCRIPTION

Figure 1:
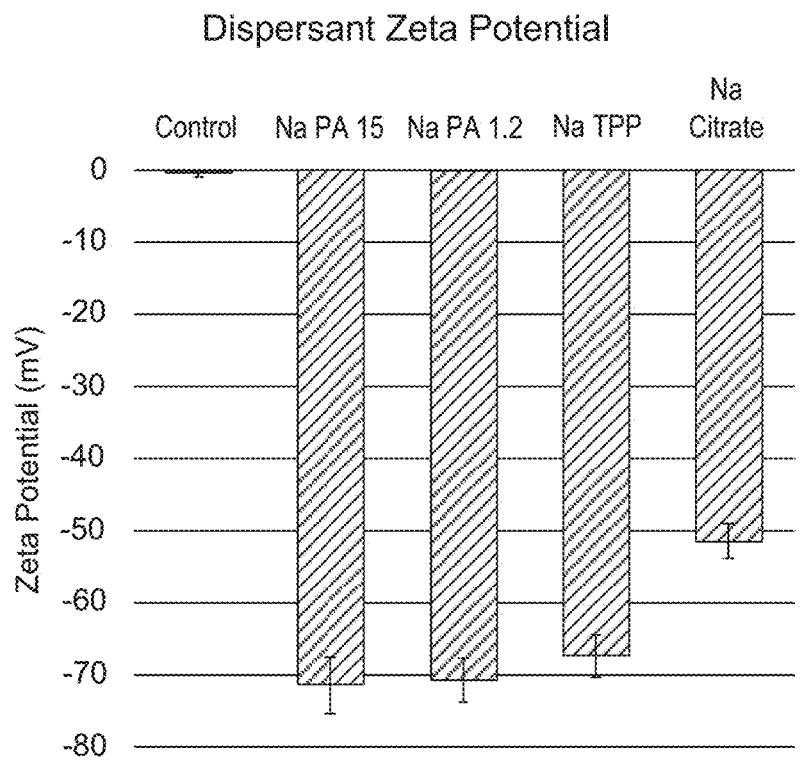
FIG. 1 shows example data illustrating zeta potential of calcium carbonate slurries with various dispersants.

The present disclosure is neither limited to any single aspect nor implementation, nor to any combinations and/or permutations of such aspects and/or implementations. Moreover, each of the aspects of the present disclosure, and/or implementations thereof, may be employed alone or in combination with one or more of the other aspects and/or implementations thereof. For the sake of brevity, many of those permutations and combinations will not be discussed and/or illustrated separately herein.

The present disclosure provides a slurry, and more particularly a slurry with calcium carbonate particles that remain in suspension over a relatively long period of time and are relatively resistant to aggregation. For example, the slurry with calcium carbonate particles remains in suspension for at least six days (e.g., seven, eight, nine, ten, twenty, or more) and is relatively resistant to aggregating by having a zeta potential that is equal to or less than −50 mV. The slurry may be used in polishing substrates, including substrates coated with soft materials. As used herein and throughout this disclosure, "soft" materials can include any polymer material or monomeric material that is cured or crosslinked. A slurry with large particles or aggregates of particles may cause scratching during the polishing of soft materials from a substrate. An effective slurry formulation of the present disclosure may include relatively small calcium carbonate particles, a relatively low concentration of calcium carbonate particles, a dispersant, and a surfactant, where the dispersant and the surfactant may keep the particles in suspension over time and reduce aggregation.

In one aspect, a slurry of the present disclosure includes at least a dispersant and a surfactant. The slurry further includes a plurality of calcium carbonate particles suspended in a solution, where the solution includes the dispersant and the surfactant. In some implementations, the solution may further include a buffer. An average diameter of the plurality of calcium carbonate particles may be relatively small, such as below a threshold average diameter. In some implementations, the calcium carbonate particles have an average diameter equal to or less than about 5 μm, between about 10 nm and about 3 μm, between about 30 nm and about 2 μm, between about 300 nm and about 2 μm, or between about 500 nm and about 1 μm, where the term "about" with respect to the average diameter of the calcium carbonate particles refers to values within plus or minus 5 percent of the stated value. Other larger or smaller values are also possible. The concentration of the calcium carbonate in the slurry can be equal to or less than about 5.0 wt. %, equal to or less than about 2.0 wt. %, between about 0.05 wt. % and about 1.0 wt. %, between about 0.1 wt. % and about 1.0 wt. %, or between about 0.1 wt. % and about 0.5 wt. %, where the term "about" with respect to the concentration of calcium carbonate throughout this disclosure refers to values within plus or minus 5 percent of the stated value. The dispersant may serve to stabilize particle distributions in the solution. The dispersant may be selected to reduce a zeta potential of the slurry, where a more negative zeta potential indicates that particles are more likely to repel each other and less likely to form aggregates. In some implementations, the zeta potential of the slurry can be equal to or less than about −50 mV. Examples of dispersants include sodium polyacrylate, sodium n-silicate, sodium tetrapyrophosphate, sodium hexametaphosphate, sodium polyalluminate, sodium tetraborate, sodium triphosphate, and sodium citrate. One or both of the dispersant and the surfactant may serve to stabilize the turbidity of the slurry. The surfactant may serve as a lubricant that lowers the surface tension between two liquids or between a liquid and a solid. In one example, the slurry may include an anionic surfactant that limits surface charge buildup, thereby reducing the zeta potential so that particles will not aggregate together. Examples of surfactants include sodium dodecyl sulfate (SDS), polysorbate, and octylphenol ethoxylate. The pH of the slurry can be between about 7 and about 12, such as between about 8.5 and about 10.5.

As used herein, a "substrate" can refer to a solid support. In some implementations, the term includes any material that can serve as a solid or semi-solid foundation for features such as wells or channels for the deposition of nucleic acids. A substrate can include any appropriate substrate materials, including but not limited to glass, modified glass, functionalized glass, silica, quartz, silicon, plastic, metal, metal oxide, or combinations thereof. In some implementations, modified glass includes a thick layer (e.g., greater than about 5 nm) of material on glass that changes one or more properties of the glass, functional glass includes a covalent or semi-covalent bond on the surface of glass, and silica includes a type of glass with a different base composition than traditional glass, where the term "about" with respect to the thickness of the thick layer of the modified glass throughout this disclosure refers to values within plus or minus 10 percent of the stated value. In some implementations, the substrate includes a cured polymer mixture on glass, such as a nanoimprinted resist material on glass.

In some implementations, the substrate can include one or more features. A feature can refer to a discrete physical element or discrete physical trait of a substrate. A discrete physical element can include a component of the substrate that is physically or structurally distinguishable. A discrete physical trait of a substrate can include an aspect of the substrate itself that provides physical or functional separability. For example, features of the substrate can be in the form of a well or channel, which may be discrete physical elements of the substrate. The substrate may be part of an array for biological or chemical analysis systems. Sequencers, such as DNA or RNA sequencers and other biological or chemical analysis systems, may utilize a glass substrate having microfluidic flow channels provided therein. Dimensions of the features of the substrate may be measured on a nanometer (nm) scale, such that the features may be referred to as nano-features according to some implementations. For example, a nano-feature can have a diameter between 0.5 nm and about 500 nm, between about 1 nm and about 100 nm, or between about 5 nm and about 50 nm, where the term "about" with respect to a diameter of a feature throughout this disclosure refers to values within plus or minus 10 percent of the stated value.

Soft materials may be part of a substrate or coated on a substrate, where a soft material can include any polymer material or monomeric material that is cured or crosslinked. In some implementations, a substrate may be coated with a soft material, including but not limited to a polymer, an inorganic hydrogel, or an organic polymeric hydrogel. For example, the soft material can include a polyacrylamide hydrogel. Sequencers may rely on attachment of nucleic acid strands to a hydrogel-coated surface of a substrate during operation. In some other implementations, a substrate may be made out of a soft material, including but not limited to a silicon-hydrocarbon array.

In some implementations, the substrate may be coated with more than one layer of soft material. For example, a substrate surface may be coated with a resist layer, and an organic polymeric hydrogel may be formed on the resist layer. The resist layer and the organic polymeric hydrogel may be deemed "soft." In some implementations, the resist layer is a nanoimprinted polymeric resist material coated via nanoimprint lithography methods.

As used herein, "polishing" a substrate can refer to mechanical and/or chemical treatment of a substrate. In some implementations, polishing can refer to removal of a part of a substrate or a coating on a substrate. Polishing can refer to rubbing, chafing, smoothing, or otherwise treating a surface of a substrate to produce an altered surface of the substrate. Polishing a substrate coated with soft materials may involve removal of at least some of the soft materials from the substrate. In some implementations, the substrate may be coated with a first soft material and a second soft material, where the second soft material has a hardness less than the first soft material, and polishing the substrate may involve removal of the second soft material without removal of the first soft material. For example, a substrate surface may include a resist layer coated with an acrylate polymer layer that is softer than the resist layer, where polishing the substrate can include removal of the acrylate polymer layer without damaging the resist layer.

When using pre-existing slurries for polishing soft materials coated on or part of a substrate, the surface of the substrate may be susceptible to scratching. In some implementations, an underlying layer upon which the soft material is formed upon may be susceptible to scratching. The surface of the substrate that is susceptible to scratching may include such layers. For example, where a surface of a substrate includes a resist layer and a softer acrylate polymer layer is disposed over the resist layer, the acrylate polymer layer is polished but the resist layer may be scratched by pre-existing slurries. In addition, soft materials coated on or part of a substrate are difficult to optimize with pre-existing slurries and have quicker feature gouging, which involves particles digging into surface features during polishing to cause excess removal of material in one area. A pre-existing slurry, such as a silica and ceria polishing slurry, may scratch the surface of the substrate and leave particles in nano-features of the substrate. However, pre-existing methods using formulations without particles exhibit high variability during polishing, require a long run time, have difficulty cleaning nano-features, and require a high pressure that can lead to substrate breakage and strain on the polisher.

The present disclosure provides in some examples a composition including a slurry, where the slurry includes a plurality of particles in a liquid. In some implementations, the composition of the present disclosure consists of or consists essentially of the slurry. As used herein, a "slurry" can refer to a fluid mixture including particles in a liquid. A calcium carbonate slurry includes particles of calcium carbonate in a liquid. A calcium carbonate slurry is capable of polishing or removing soft materials coated on a substrate or part of the substrate. In addition, calcium carbonate particles in the slurry are generally softer than ceria or silica particles, and are less likely to scratch a surface of a substrate during polishing. Moreover, calcium carbonate slurries are generally cheaper than ceria or silica slurries. However, large calcium carbonate particles or small calcium carbonate particles that aggregate to a large size will scratch the surface of the substrate during polishing, thereby decreasing the performance and quality of the slurry.

An effective calcium carbonate slurry may be formulated that keeps the calcium carbonate particles in suspension for a long period of time and is resistant to aggregation of the calcium carbonate particles. This allows the calcium carbonate slurry to polish soft materials from the surface of the substrate with less scratching of the surface in a more robust and reproducible manner compared to pre-existing slurries. The performance or quality of the polish may be correlated with the formulation of the calcium carbonate slurry in terms of size of the particles in the slurry, the particles' tendency towards aggregation, and the consistency of the solids delivery. The size of the particles in the slurry may be measured by dynamic light scattering (DLS), the particles' tendency towards aggregation may correspond to a zeta potential of the slurry, and the consistency of solids delivery may be determined at least in part using turbidity.

Particle size may be determined using DLS. In some examples, DLS uses a laser to scatter light off of particles undergoing Brownian motion, determining the particles' speed. Knowing the viscosity and temperature of the particle, a DLS instrument calculates the size of the particle. Larger particles undergo slower Brownian motion and smaller particles move faster. DLS can determine the size distribution of particles and the percentage of particles having a diameter equal to or greater than a threshold diameter, such as having a diameter equal to or greater than about 4 µm.

The quality of a polish can be adversely affected by the presence of large particles in the slurry. Some of the large particles may include aggregates of smaller particles. As used herein, the term "large particles" or "oversized particles" include particles having a diameter equal to or greater than a threshold diameter, or aggregates of smaller particles having a diameter equal to or greater than the threshold diameter. In some implementations, a threshold diameter may be about 3 µm, about 4 µm, about 5 µm, about 6 µm, about 7 µm, about 8 µm, about 9 µm, or about 10 µm. It will be understood that establishing a threshold diameter for a large particle or an oversized particle may depend on various factors such as the composition of the substrate, the composition of the slurry, pressure applied during polishing, size of surface features, potential for surface damage, polishing pad choice, material that a glass is functionalized with (e.g., if this material is softer, it may be more susceptible to scratching), etc. By way of an example, a threshold diameter for a large particle or an oversized particle may be equal to or greater than about 4 µm when polishing soft materials on a glass substrate, where particles having a diameter equal to or greater than 4 µm may be capable of scratching the surface of the glass substrate. Scratching on a polished surface may be determined using an imager and a microscope.

It may be desirable to limit a number of large particles or oversized particles in the slurry so that an average diameter of the plurality of particles in the slurry is less than a threshold diameter, or that a size distribution of the plurality of particles has a small percentage of particles that are equal to or greater than the threshold diameter. In some implementations, the size distribution of the plurality of particles has less than about 10%, less than about 5%, or less than about 3% of a total number of particles equal to or greater than the threshold diameter. To illustrate an example with respect to average diameter, the calcium carbonate slurry may include a plurality of particles suspended in a solution, where an average diameter of the plurality of calcium carbonate particles is equal to or less than about 5 µm, between about 10 nm and about 3 µm, between about 30 nm and about 2 µm, between about 300 nm and about 2 µm, or between about 500 nm and about 1 µm, where the term "about" with respect to an average diameter of the plurality of calcium carbonate particles throughout this disclosure refers to values within plus or minus 5 percent of the stated value. In some implementations, a standard deviation for an average diameter of the calcium carbonate particles can be within plus or minus 120 nm. To illustrate an example with respect to size distribution, the calcium carbonate slurry may include a plurality of particles suspended in a solution, where less than about 5% of a total number of the calcium carbonate particles have a diameter equal to or greater than about 4 µm, where the term "about" with respect to a percentage of the total number of calcium carbonate particles throughout this disclosure refers to values within plus or minus 5 percent of the stated value.

Though the size of the calcium carbonate particles suspended in solution may initially be small, the calcium carbonate particles may naturally aggregate over time to form larger particles or aggregates. The presence of large particles or aggregates increases the likelihood of scratching a surface of a substrate during polishing. Particle aggregation may be reduced by particle charge repulsion. Zeta potential is an indicator of the stability of colloidal dispersions and serves as a metric to determine the propensity of particles in a slurry to aggregate. Zeta potential can refer to an electric potential in an electrical double layer at the location of a slipping plane for a particle relative to a point in the liquid away from the electrical double layer. The electrical double layer is a layer that appears on a surface of a particle when exposed to a fluid, which can include charged species that move in the fluid under the influence of electric attraction and thermal motion. Zeta potential is a quantity related to electrophoretic mobility by Henry's equation: $U_E = 2\varepsilon z F(ka)/3\eta$, where $U_E$ is electrophoretic mobility, z is zeta potential, ε is dielectric constant, F(ka) is Henry's function, and η is viscosity. In polar media, F(ka) is approximately 1.5 and in nonpolar media F(ka) is approximately 1. In some implementations, zeta potential can be measured using a Malvern Zetasizer. A more negative zeta potential is indicative that particles in the slurry will strongly repel each other and are less likely to form aggregates. A more positive zeta potential is indicative that particles in the slurry will attract each other and are more likely to form aggregates.

The ionic strength of the solution may have an effect on zeta potential. In some implementations, the ionic strength of the solution may be adjusted by a buffer and a concentration of the buffer. The concentration of the buffer may be adjusted by diluting it in a solvent, such as water. In some implementations, the buffer can include tris(hydroxymethyl)aminomethane (TRIS) buffer. Other possible buffers include but are not limited to sodium phosphate, sodium citrate, and sodium carbonate. In some implementations, the buffer may be able to achieve a pH between 9 and 12 in the solution. In some implementations, a TRIS buffer may be diluted to a desired concentration. For example, a 0.1 M TRIS buffer may be diluted by deionized water to get a concentration between about 0.01 M and about 0.05 M, or between about 0.02 M and about 0.04 M.

In some implementations, the solution can further include a chelating agent, such as ethylenediaminetetraacetic acid (EDTA). Other chelating agents include but are not limited to diethylenetriaminepentaacetic acid (DTPA) and nitrilotriacetic acid (NTA). The chelating agent may be capable of sequestering metal ions, such as calcium ions, in solution.

Additives may be introduced to the slurry to reduce (i.e., make more negative) the zeta potential of the slurry. Additives for reducing the zeta potential of the slurry can include but are not limited to a dispersant and a surfactant. Such additives can be considered part of a solution of a calcium carbonate slurry, whereas calcium carbonate particles as discussed herein can be considered suspended in the solution of the calcium carbonate slurry. Some slurries, such as silica or silicon-based slurries, have a zeta potential of about −30 mV or greater. In some implementations, a calcium carbonate slurry with one or more additives has a zeta potential of about −30 mV or less, of about −40 mV or less, of about −50 mV or less, or of about −60 mV or less, where the term "about" with respect to zeta potential of the slurry throughout this disclosure refers to values within plus or minus 5 percent of the stated value.

One type of additive for reducing the zeta potential of the slurry is a dispersant. A dispersant is an agent that is used to stabilize particle distributions in liquid systems. It can include a polymer or molecule added to a suspension to improve separation of particles in the suspension. The dispersant increases the electrical double layer of the particles in the suspension to reduce aggregation. Examples of dispersants added to a calcium carbonate slurry can include but are not limited to sodium polyacrylate of various molecular weights, sodium n-silicate, sodium tetrapyrophosphate, sodium hexametaphosphate, sodium polyalluminate, sodium tetraborate, sodium triphosphate, sodium citrate, or combinations thereof. In some implementations, the dispersant has a concentration in the slurry between about 0.01 wt. % and about 50.0 wt. %, between about 0.1 wt. % and about 10.0 wt. %, or between about 0.5 wt. % and about 5.0 wt. %, where the term "about" with respect to dispersant concentration in the slurry throughout this disclosure refers to values within plus or minus 10 percent of the stated value. For example, the dispersant can have a concentration in the slurry between about 0.1 wt. % and about 0.5 wt. %.

FIG. 1 shows example data illustrating zeta potential of calcium carbonate slurries with various dispersants. The calcium carbonate slurry in FIG. 1 included 0.125 wt. % 2 µm calcium carbonate particles with 0.03 M TRIS buffer at pH 10.4. Four different dispersants were tested: sodium polyacrylate with molecular weight 15,000, sodium polyacrylate with molecular weight 1,200, sodium tetrapyrophosphate, and sodium citrate. Each of these dispersants was added to the solution at a concentration of 0.25 wt. % in the slurry. Data from a control slurry (no dispersant) is also shown. As shown in FIG. 1, addition of a dispersant in the calcium carbonate slurry reduces the zeta potential of the slurry. Sodium polyacrylate as a dispersant had the greatest effect on zeta potential among the tested dispersants in FIG. 1.

The molecular weight of the dispersant can influence the tendency of particles to aggregate in the slurry. In some examples, if the molecular weight is too small, short chains in the dispersant will not provide a sufficiently thick barrier to prevent flocculation, which leads to adhesion of particles suspended in solution to form larger-size clusters. If the molecular weight is too large, however, the dispersant will start to act as a flocculant.

Figure 2:
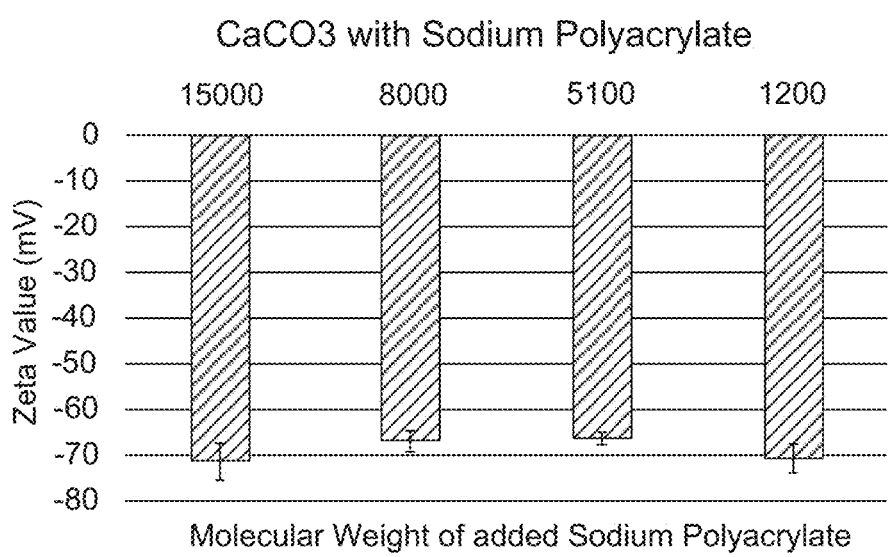
FIG. 2 shows example data illustrating zeta potential for calcium carbonate slurries with various molecular weights of sodium polyacrylate dispersant.

FIG. 2 shows example data illustrating zeta potential for calcium carbonate slurries with various molecular weights of sodium polyacrylate dispersant. Sodium polyacrylate comes in different molecular weights, and selection of an appropriate molecular weight may be important in lowering zeta potential. The calcium carbonate slurry in FIG. 2 included 0.125 wt. % 2 μm calcium carbonate particles with 0.03 M TRIS buffer at pH 10.4. Sodium polyacrylate at four different molecular weights of 15,000, 8,000, 5,100, and 1,200 were added at 0.25 wt. % to each sample of calcium carbonate slurry and tested. In FIG. 2, the zeta potential between a molecular weight of 1,200 and a molecular weight of 15,000 exhibited little difference. While the various molecular weights tested in FIG. 2 did not exhibit an appreciable difference, it is possible and perhaps likely that molecular weights at further extremes will exhibit greater effects on zeta potential.

The concentration of the dispersant in the slurry also can influence the tendency of particles to aggregate. If the concentration of the dispersant is too low, dispersant molecules adsorbed to the particles may only partially cover each of the particles and provide limited performance in increasing the electrical double layer of the particle. If the concentration of the dispersant is too high, the molecular structure of dispersant molecules adsorbed to the particles may collapse or "fold back" on themselves, thereby allowing particles to aggregate or flocculate.

Figure 3A:
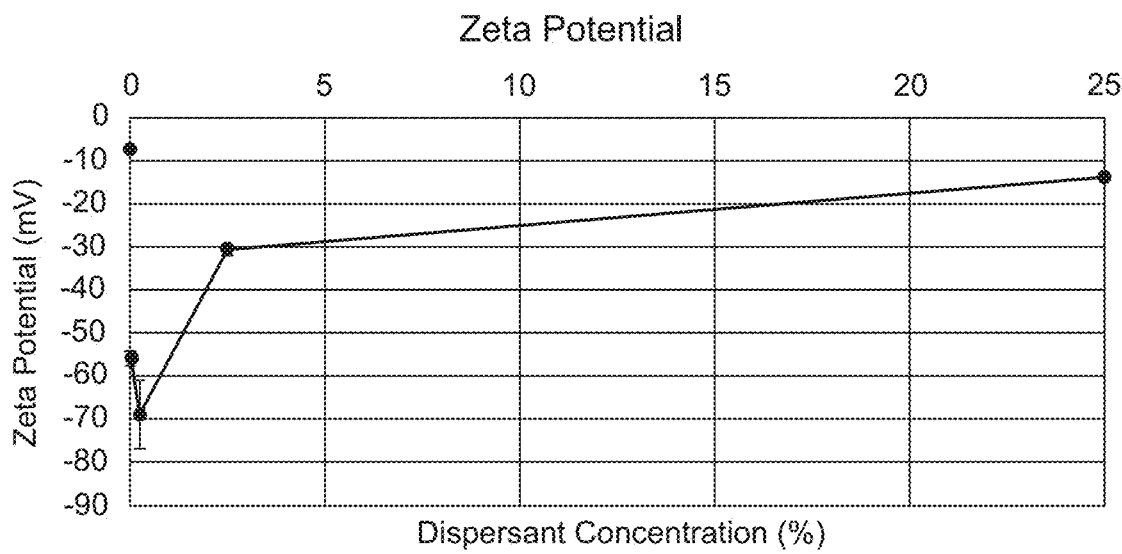
FIGS. 3A and 3B show example data illustrating zeta potential for calcium carbonate slurries with different concentrations of sodium polyacrylate dispersant.
Figure 3B:
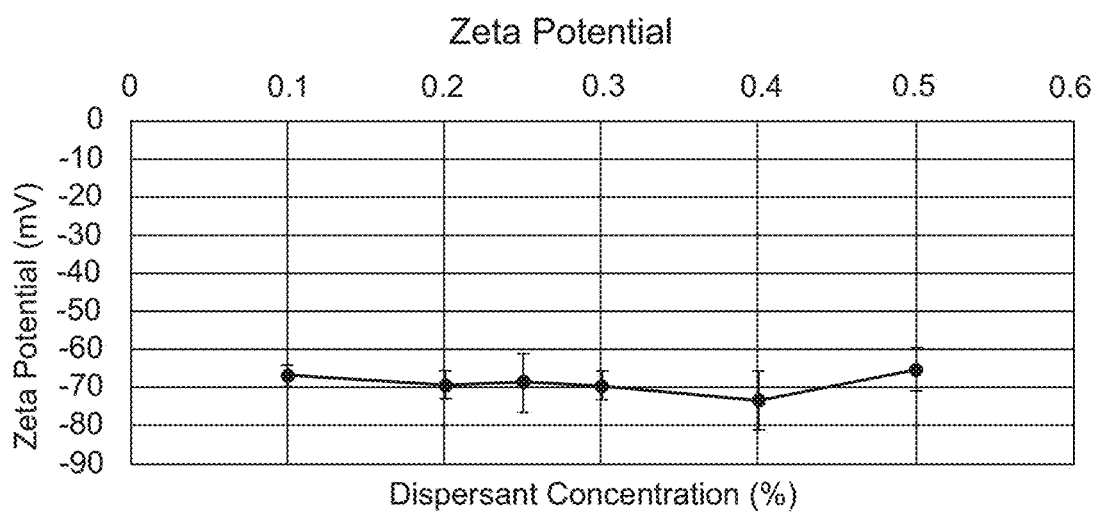

FIGS. 3A and 3B show example data illustrating zeta potential for calcium carbonate slurries with different concentrations of sodium polyacrylate dispersant in one non-limiting working example. FIG. 3A shows zeta potential data for sodium polyacrylate dispersant concentrations between 0.025 wt. % and 25.0 wt. %. FIG. 3B shows zeta potential data for sodium polyacrylate dispersant concentrations between 0.1 wt. % and 0.5 wt. %. The sodium polyacrylate had a molecular weight of 1,200. The calcium carbonate slurry in FIGS. 3A and 3B included 0.125 wt. % 2 μm calcium carbonate particles with 0.03 M TRIS buffer at pH 10.4. In FIGS. 3A and 3B, slurries with a dispersant concentration between about 0.1 wt. % and about 0.5 wt. %, or between about 0.2 wt. % and about 0.4 wt. %, exhibited the lowest zeta potential.

Another type of additive that may reduce the zeta potential of the slurry is a surfactant. A surfactant is an agent that assists in the spreading of one phase into another, whether in solid-liquid systems or liquid-liquid systems. The surfactant serves to lower the surface tension between two liquids or between a liquid and a solid. In other words, the surfactant can act like a lubricant. In a calcium carbonate slurry, the surfactant added to the slurry can be an anionic surfactant. An anionic surfactant contains an anionic functional group at one end, such as a sulfate, sulfonate, phosphate, and carboxylate functional group. By having a negative charge at one end, the anionic surfactant may prevent surface charge buildup from being too high on calcium carbonate particles. That way, the calcium carbonate particles do not aggregate. Examples of surfactants added to a calcium carbonate slurry can include but are not limited to sodium dodecyl sulfate (SDS), polysorbate, octylphenol ethoxylate, or combinations thereof. Tween® 20 is an example of a polysorbate and Triton™ X-100 is an example of an octylphenol ethoxylate. Tween® 20 is manufactured by Croda International plc of East Riding of Yorkshire, UK. Triton™ X-100 is manufactured by Rohm and Haas Company of Philadelphia, Pa., USA. Selection of the concentration of the surfactant may depend on the critical micellar concentration of the surfactant. The critical micellar concentration is the surfactant concentration above which the surfactant will form micelles in the solution. In some implementations, the surfactant has a concentration in the slurry of between about 0.01 wt. % and about 10.0 wt. %, between about 0.05 wt. % and about 5.0 wt. %, or between about 0.1 wt. % and about 2.0 wt. %, where the term "about" with respect to surfactant concentration in the slurry throughout this disclosure refers to values within plus or minus 10 percent of the stated value.

Figure 4:
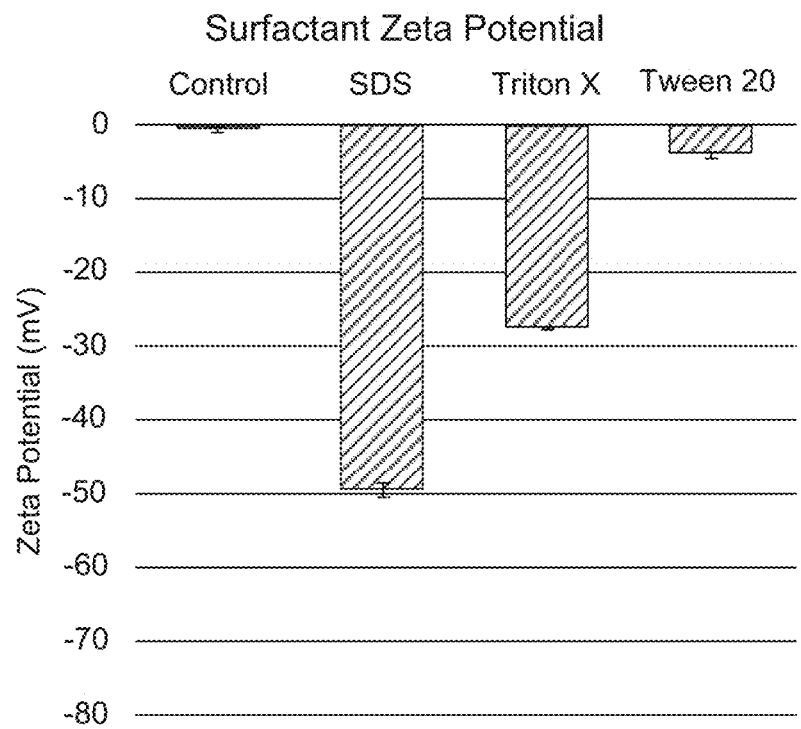
FIG. 4 shows example data illustrating zeta potential of calcium carbonate slurries with various surfactants.

FIG. 4 shows example data illustrating zeta potential of calcium carbonate slurries with various surfactants. The calcium carbonate slurry in FIG. 4 included 0.125 wt. % 2 μm calcium carbonate particles with 0.03 M TRIS buffer at pH 10.4. Three different surfactants were tested: SDS, Tween® 20, and Triton™ X-100. Each of these surfactants were added at a concentration of 0.125 wt. %. As shown in FIG. 4, addition of a surfactant in the calcium carbonate slurry reduces the zeta potential of the slurry. SDS as a surfactant had the greatest effect on zeta potential among the tested surfactants in FIG. 4.

Figure 5:
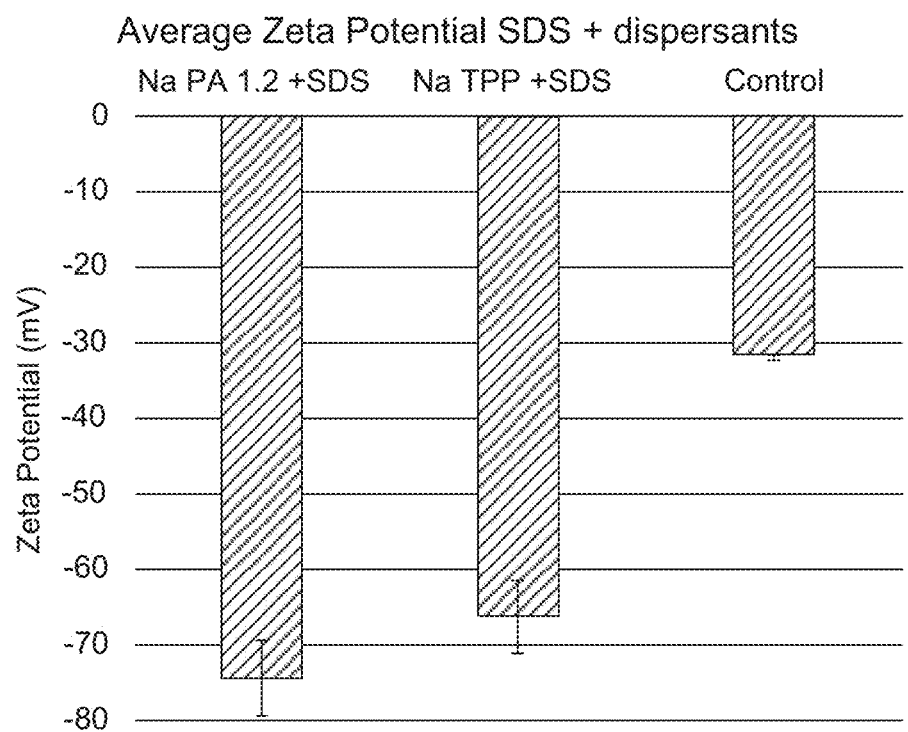
FIG. 5 shows example data illustrating zeta potential of calcium carbonate slurries with various dispersants combined with sodium dodecyl sulfate (SDS) surfactant.

A surfactant and a dispersant may be added to a solution of a slurry. The combination of the surfactant and the dispersant in the slurry can have an even greater effect on zeta potential than a surfactant individually or a dispersant individually. FIG. 5 shows example data illustrating zeta potential of calcium carbonate slurries with various dispersants combined with SDS surfactant. The calcium carbonate slurry in FIG. 5 included 0.125 wt. % 2 μm calcium carbonate particles with 0.03 M TRIS buffer at pH 10.4. Sodium polyacrylate combined with SDS had a zeta potential that was more negative than sodium tetrapyrophosphate combined with SDS. Accordingly, sodium polyacrylate combined with SDS was more effective in reducing zeta potential of the slurry.

The pH of the slurry may affect the zeta potential of the slurry. In some implementations, a pH that is closer to the pKa of calcium carbonate is likely to have a lower zeta potential. The pKa of calcium carbonate is about 9. Moreover, the pH of the slurry may affect the performance and quality of the slurry, where both positive and negative extremes of pH can be harmful. In one example, at too low of pH, calcium carbonate particles dissolve. In one example, at too high of pH, the calcium carbonate slurry can corrode electrodes and damage flow cell chemistry of a substrate. In some implementations, the pH of the calcium carbonate slurry is between about 7 and about 12, such as between about 8.5 and about 10.5, where the term "about" with respect to pH throughout this disclosure refers to values within plus or minus 5 percent of the stated value. In a particular example, the pH of the calcium carbonate slurry may be about 9.

Figure 6:
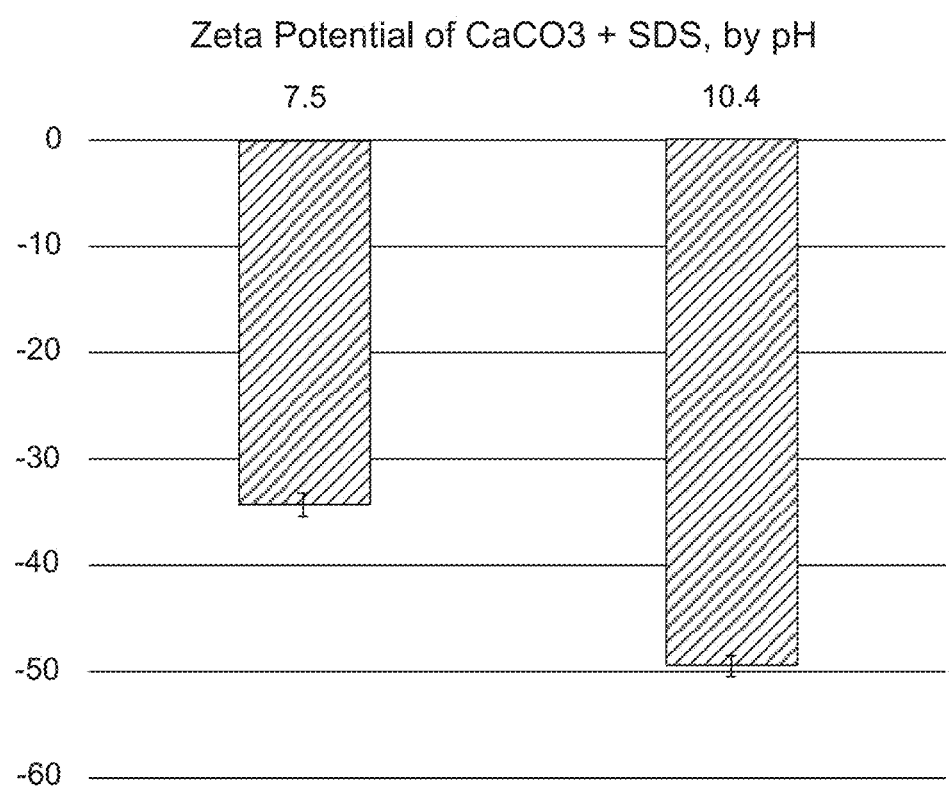
FIG. 6 shows example data illustrating zeta potential of calcium carbonate slurries at different pH.

FIG. 6 shows example data illustrating zeta potential of calcium carbonate slurries at different pH. The calcium carbonate slurries in FIG. 6 included 0.125 wt. % 2 μm calcium carbonate particles with 0.125 wt. % SDS and with 0.03 M TRIS buffer. FIG. 6 shows that the pH of the slurry affects the zeta potential of the slurry. The calcium carbonate slurry had a more negative zeta potential at pH 10.4 than at pH 7.5. This may be due in part to the dissolution of calcium carbonate particles at lower pH values.

As discussed earlier, the consistency of solids delivery in a calcium carbonate slurry may be determined using turbidity. Turbidity is a measurement of the cloudiness or haziness of a fluid caused by particles suspended in the liquid. If turbidity is too low, the calcium carbonate particles may settle rather than remain in suspension after a period of time. This may adversely limit the effectiveness of polishing a substrate with a calcium carbonate slurry. A unit of measurement of turbidity is Nephelometric Turbidity Unit (NTU), which is a measurement of the amount of light scattered at a 90 degree angle from an incident light beam by particles. The settling rate of the particles and how well the particles to remain in suspension can be determined by taking turbidity measurements over a period of time. A reduced turbidity measurement over time is indicative of particles settling faster and not remaining in suspension.

Figure 7:
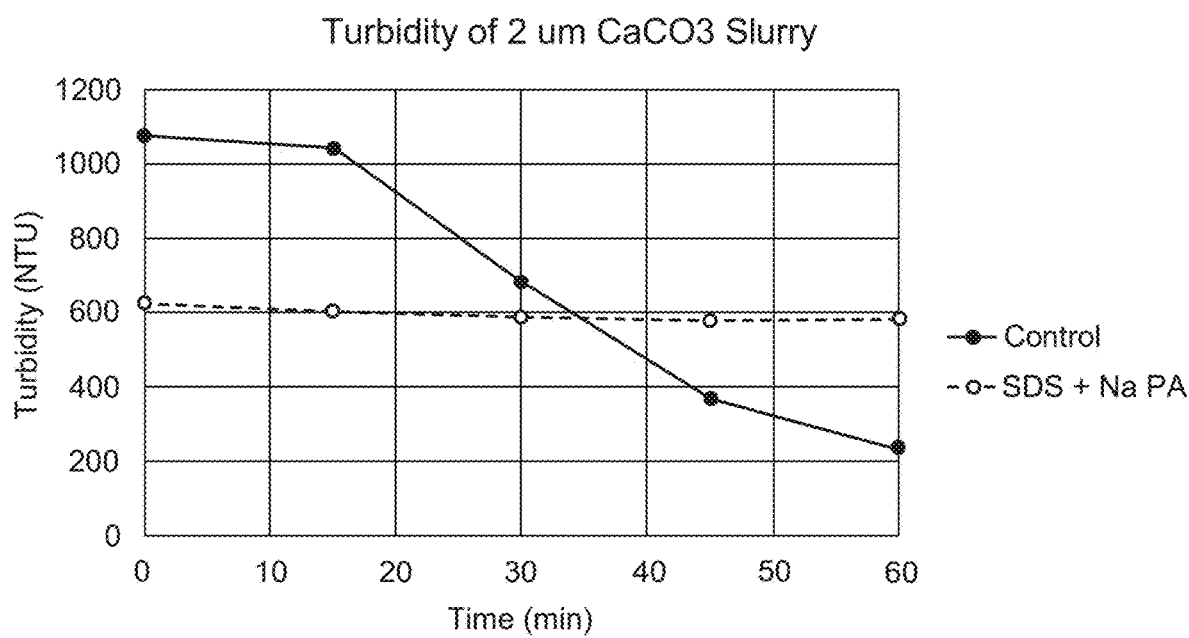
FIG. 7 shows example data illustrating turbidity of a calcium carbonate slurry without additives and a calcium carbonate slurry with a dispersant and surfactant.
Figure 8A:
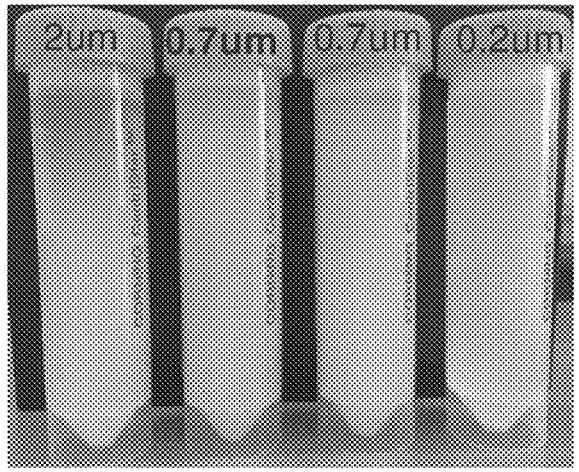
FIGS. 8A-8D show images of example calcium carbonate slurries with different sizes of calcium carbonate particles after 2 hours, 4 hours, 7 hours and 24 hours, respectively.
Figure 8B:
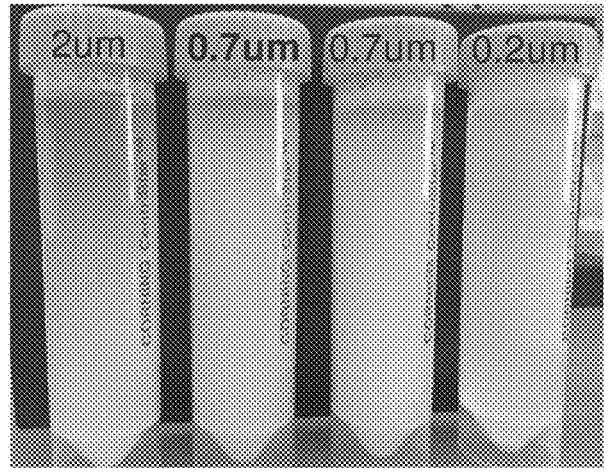
Figure 8C:
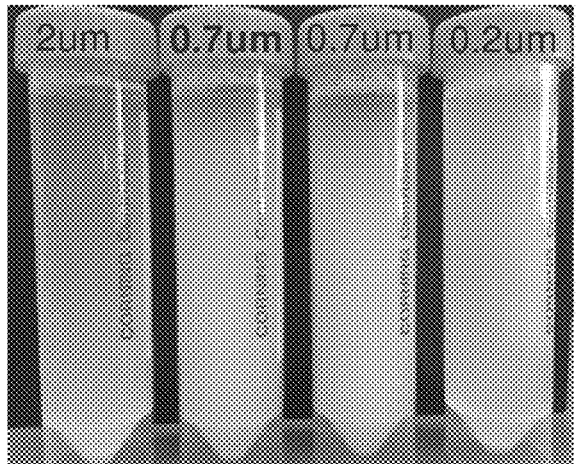
Figure 8D:
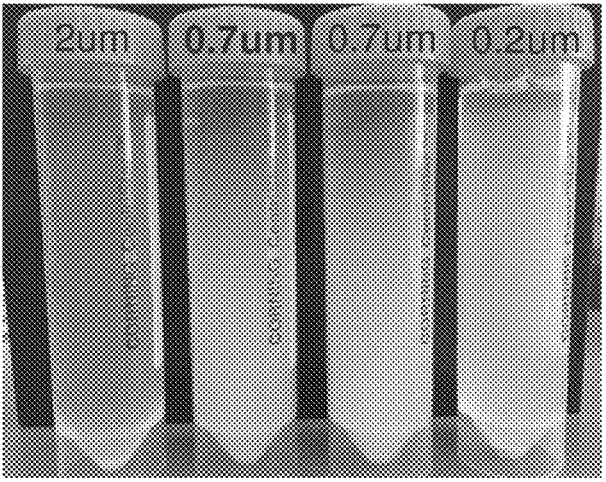

FIG. 7 shows example data illustrating turbidity of a calcium carbonate slurry without additives and a calcium carbonate slurry with a dispersant and surfactant. Turbidity was measured every 15 minutes over the course of an hour for a control slurry having 0.0625 wt. % 2 μm calcium carbonate particles with 0.05 M TRIS buffer at pH 9. The control slurry did not have a surfactant or a dispersant. Turbidity also was measured every 15 minutes over the course of an hour for the same slurry but added with 0.25 wt. % sodium polyacrylate having molecular weight of 1,200 and added with 0.125 wt. % SDS. In the span of one hour, the control slurry reduced in turbidity, indicating that the absence of a dispersant and a surfactant increases the settling rate of the particles in the slurry. However, the calcium carbonate slurry with a dispersant and with a surfactant maintained a substantially similar turbidity, indicating that the presence of a dispersant and/or a surfactant stabilizes the slurry. Addition of a dispersant and/or surfactant may contribute to keeping calcium carbonate particles in suspension over a long period of time.

The settling rate and how well the particles remain in suspension may also be visually inspected over time. Particle size of the calcium carbonate particles may influence the settling rate of the calcium carbonate slurry. FIGS. 8A-8D show images of calcium carbonate slurries with different sizes of calcium carbonate particles after 2 hours, 4 hours, 7 hours, and 24 hours. Each calcium carbonate slurry sample included 0.125 wt. % calcium carbonate, 0.125 wt. % SDS, 0.25 wt. % polyacrylic acid, 1 mM EDTA, and 0.1 M TRIS at pH 9. One sample included 2 μm calcium carbonate particles, two samples included 0.7 μm calcium carbonate particles, and one sample included 0.2 μm particles. After 24 hours, the settling rate of the 2 μm calcium carbonate particles was noticeably greater than the others. Smaller particles may have a slower settling rate than larger particles.

Not only do the particles in a slurry settle over time, but the particles in a slurry may aggregate over time. In some implementations, different mixing or agitation mechanisms can be utilized to circulate or mix the plurality of calcium carbonate particles in the solution. Such a mixing or agitation mechanism can keep the percent solids constant, increase the shelf life of the slurry with constant mixing, and prevent or otherwise reduce the formation of aggregates that are undesirable to polishing quality. The mixing or agitation mechanism also may fracture some of the particles to a smaller size. Examples of mixing or agitation mechanisms include but are not limited to a diaphragm pump, a magnetic stir bar, an impeller-type mixer, a slurry pump, a peristaltic pump, and a high pressure pump.

Particles or aggregates having a diameter equal to or greater than a certain threshold diameter may be deemed oversized and harmful. In one particular example, particles or aggregates having a diameter greater than about 4 μm may be deemed oversized and harmful. However, it is understood that other threshold diameters for establishing harmful or oversized particles or aggregates are appropriate. Utilization of a mixing or agitation mechanism prior to polishing may limit aggregation of particles into oversized particles.

Figure 9A:
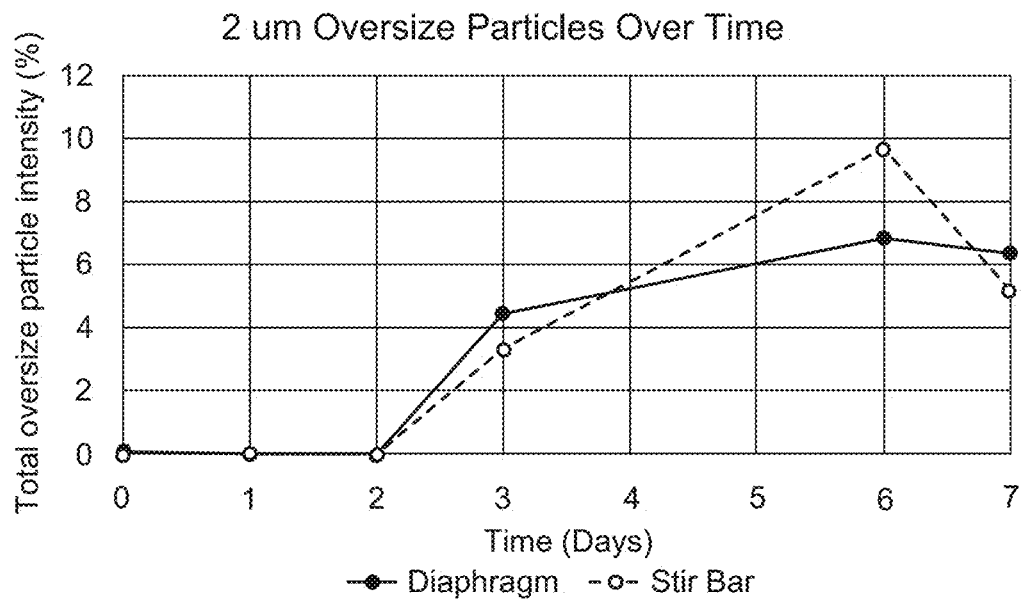
FIG. 9A shows example data illustrating a percentage of oversized calcium carbonate particles over time for a 2 μm slurry mixed with a diaphragm pump and a 2 μm slurry mixed with a stir bar.

FIG. 9A shows example data illustrating a percentage of oversized calcium carbonate particles over time for a 2 μm slurry mixed with a diaphragm pump and a 2 μm slurry mixed with a stir bar. As used herein, an X μm slurry refers to a slurry with particles having an average diameter of X μm and a Y nm slurry refers to a slurry with particles having an average diameter of Y nm. In some implementations, the standard deviation for the average diameter may be plus or minus 120 nm or plus or minus 400 nm. In this example, oversized particles are particles that are over 4 μm in diameter. After three days, roughly 4% of a total number of calcium carbonate particles were above 4 μm in diameter for both pumps. After six days, almost 10% of the total number of calcium carbonate particles were above 4 μm in diameter for both pumps.

Figure 9B:
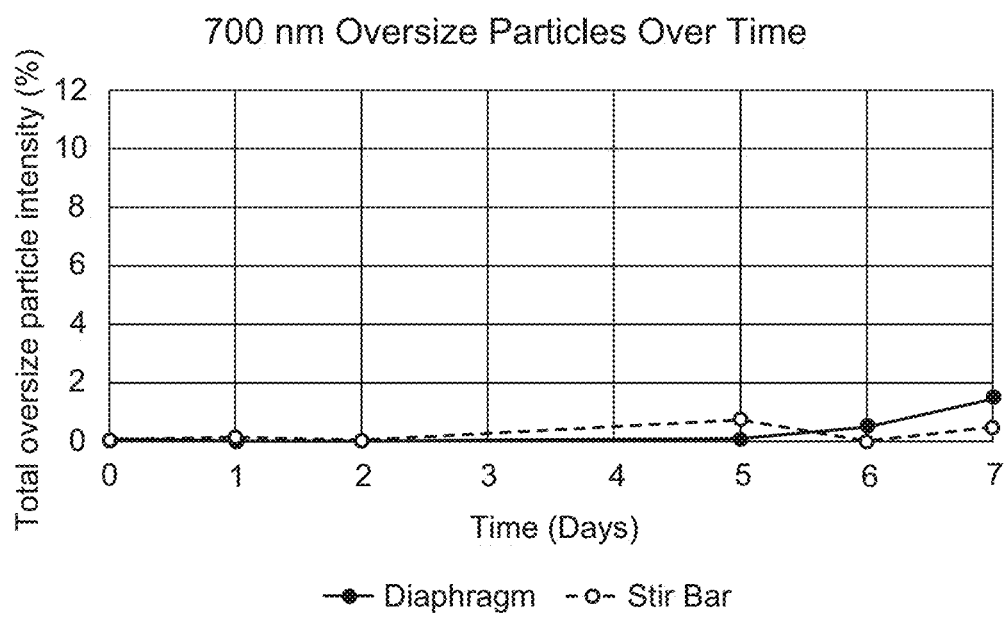
FIG. 9B shows example data illustrating a percentage of oversized calcium carbonate particles over time for a 700 nm slurry mixed with a diaphragm pump and a 700 nm slurry mixed with a stir bar.

FIG. 9B shows example data illustrating a percentage of oversized calcium carbonate particles over time for a 700 nm slurry mixed with a diaphragm pump and a 700 nm slurry mixed with a stir bar. Even after 6 days, less than 2% of the total number of calcium carbonate particles were above 4 μm in diameter for both pumps. FIGS. 9A and 9B show that it may take fewer 2 μm particles than 700 nm particles to aggregate to a harmful size.

Figure 10A:
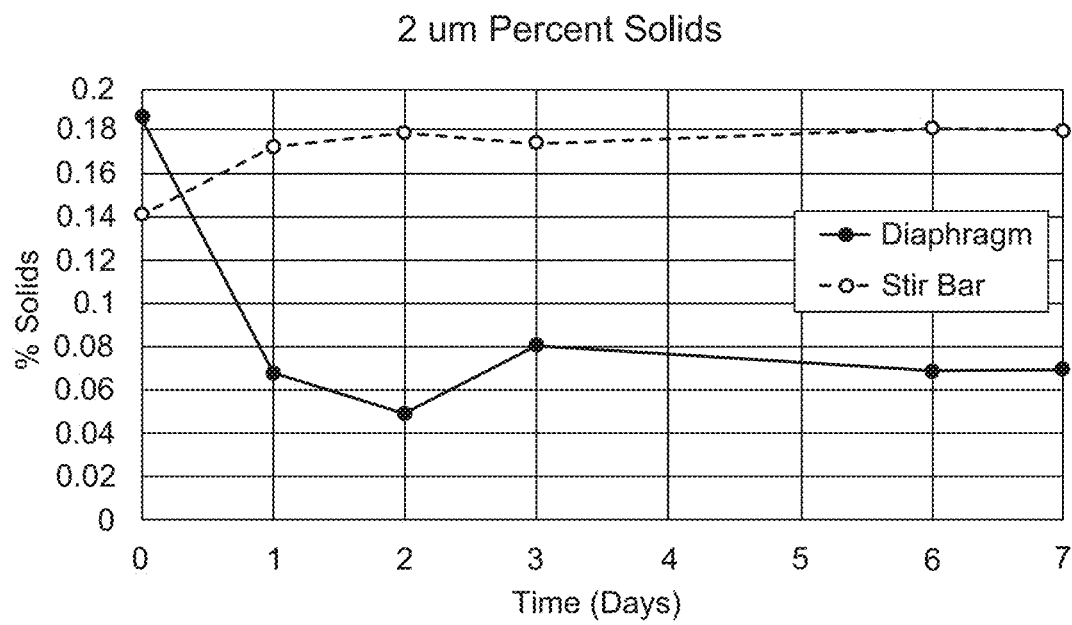
FIG. 10A shows example data illustrating percent solids measurements for a 2 μm slurry mixed with a stir bar and a 2 μm slurry mixed with a diaphragm pump.

The settling rate of particles can be measured using percent solids measurements in addition to or instead of turbidity measurements. Percent solids measurements can be made by comparing a sample weight before and after being centrifuged, aspirated, and dried. For example, percent solids measurements were made for slurries having 0.25 wt. % calcium carbonate particles with 0.25 wt. % sodium polyacrylate, 0.125 wt. % SDS, and TRIS buffer at pH 9. The percent solids measurements were made across a span of seven days, where a 1 mL aliquot was taken each day and dried in a 60° C. oven for an hour, and a weight difference was measured. FIG. 10A shows example data illustrating percent solids measurements for a 2 μm slurry mixed with a stir bar and a 2 μm slurry mixed with a diaphragm pump.

Figure 10B:
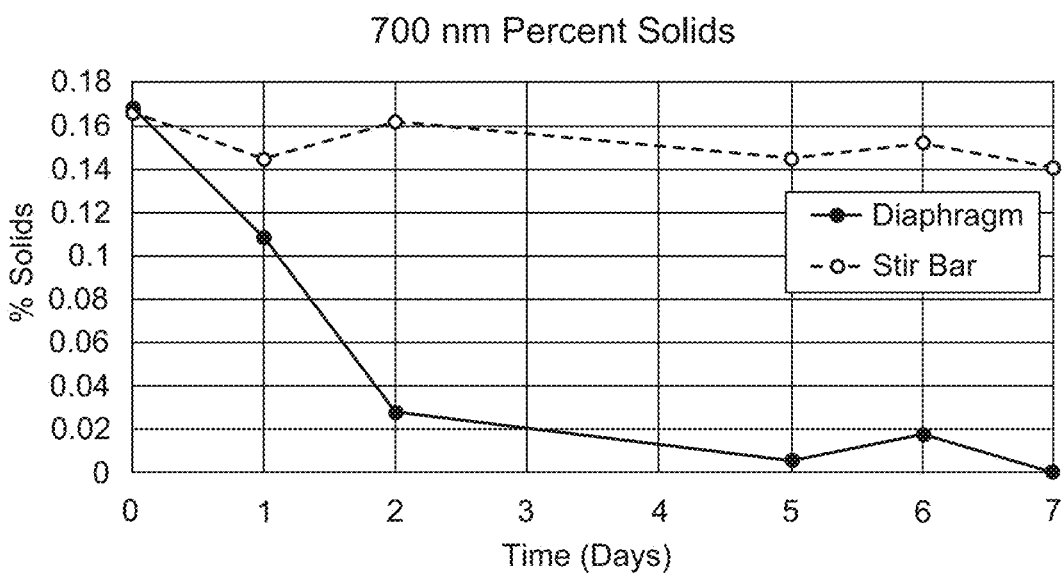
FIG. 10B shows example data illustrating percent solids measurements for a 700 nm slurry mixed with a stir bar and a 700 nm slurry mixed with a diaphragm pump.

FIG. 10B shows example data illustrating percent solids measurements for a 700 nm slurry mixed with a stir bar and a 700 nm slurry mixed with a diaphragm pump. Within one day, in both FIGS. 10A and 10B, the amount of solids in the diaphragm pump decreased sharply while the stir bar percent solids remained roughly the same. Thus, the stir bar was more effective in keeping particles suspended.

Figure 11A:
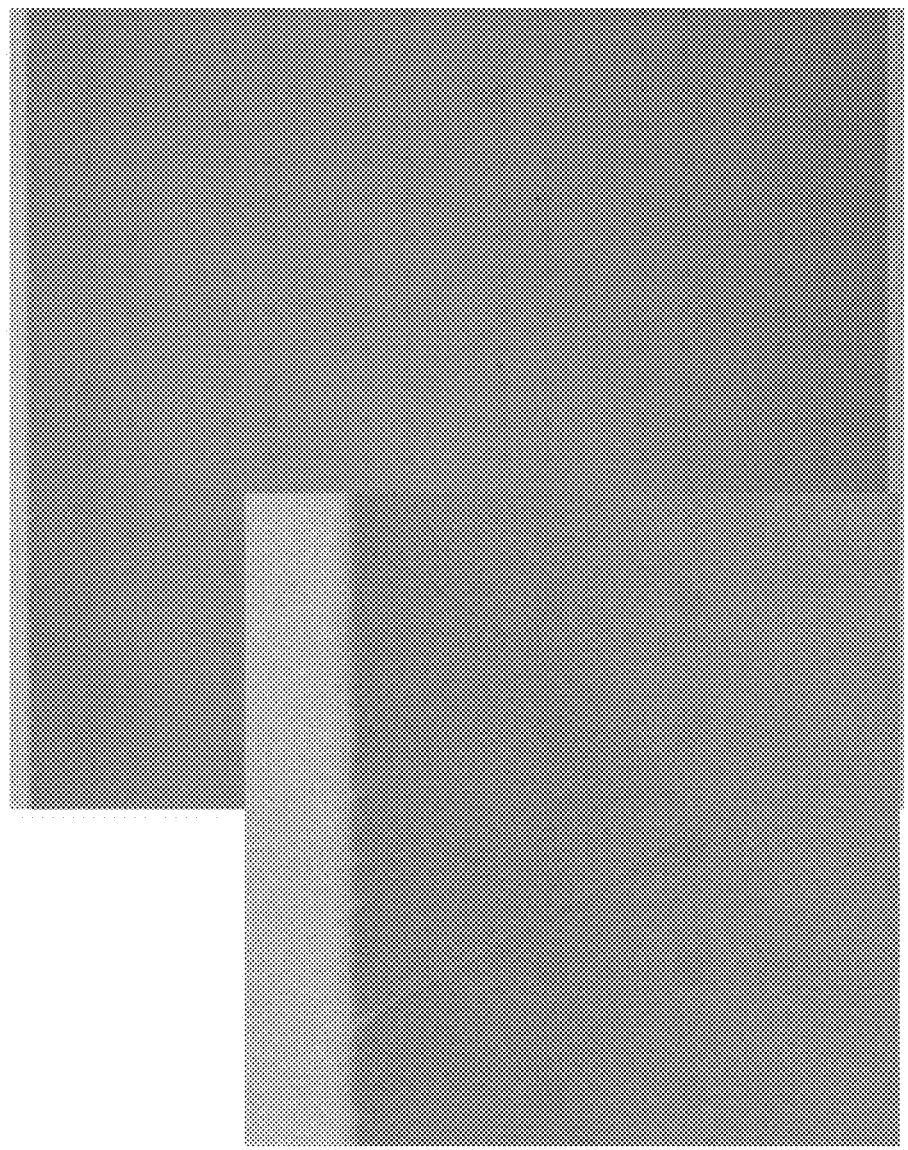
FIGS. 11A-11C show a series of images of substrates polished using various example calcium carbonate slurries.
Figure 11B:
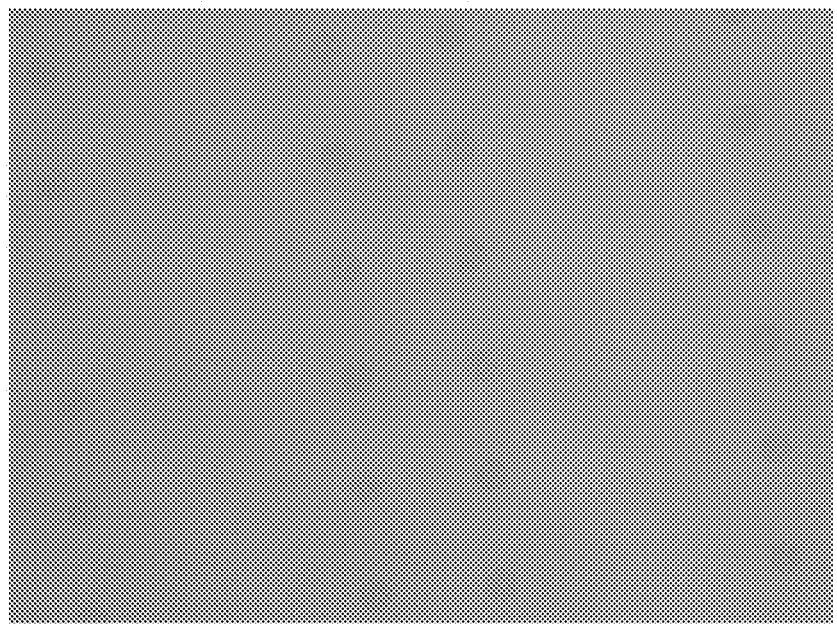
Figure 11C:
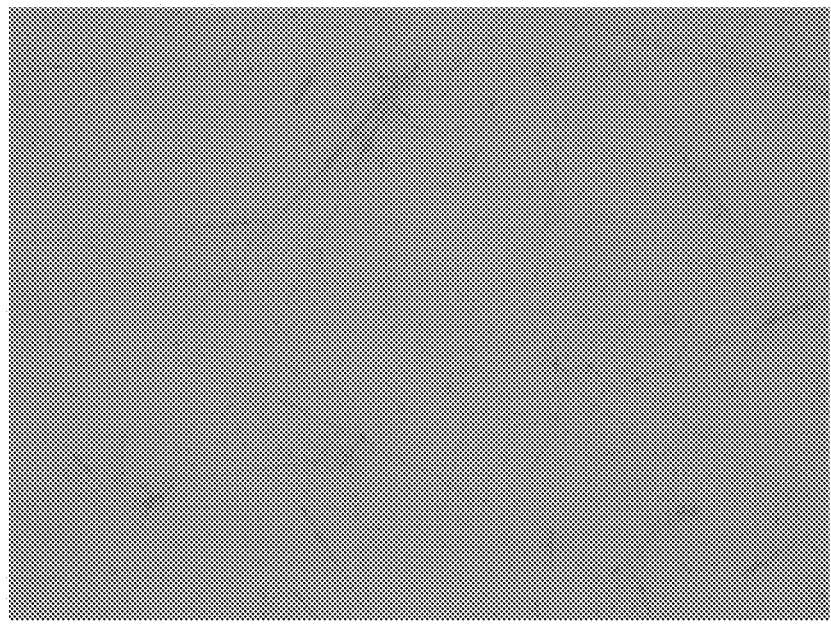

In some implementations, the quality of a polished surface can be determined in part by the amount of scratching on the polished surface using an imager and a microscope. For example, scratching on a polished surface of a substrate can be determined using a Nikon high resolution imager and a Zeiss confocal microscope. The calcium carbonate slurry may polish one or more soft materials coated on a substrate without scratching or substantially scratching an underlying layer. For example, "substantially" in the context of scratching refers to the presence of any scratches having a size that is equal to or larger than 1 μm when observed using optical microscopy. FIGS. 11A-11C show a series of images of substrates polished using a calcium carbonate slurry. FIG. 11A shows an image of a substrate polished with 2 μm particles and with dispersant. Some scratching of the substrate appeared near the edges of the substrate. FIG. 11B shows an image of a substrate polished with 2.5 μm calcium carbonate slurry, and FIG. 11C shows an image of a substrate polished with a 4.5 μm calcium carbonate slurry. The substrate polished using large particles exhibited more scratching than the substrate polished using smaller particles.

FIG. 12 shows a flow diagram illustrating an example method for polishing a surface of a substrate. The method 1200 may be performed with different, fewer, or additional operations.

At block 1220 of the method 1200, a surface of a substrate is polished with a calcium carbonate slurry, where the substrate is coated with a soft material. The calcium carbonate slurry includes a dispersant, an anionic surfactant, and a plurality of calcium carbonate particles suspended in a solution.

In some implementations, at block 1210 of the method 1200 and prior to block 1220, the plurality of calcium carbonate particles are optionally mixed in the solution including the dispersant and the anionic surfactant to form the calcium carbonate slurry. The mixing may occur using one or more of a magnetic stir bar, impeller type mixer, diaphragm pump, slurry pump, peristaltic pump, and high pressure pump.

In some implementations, a concentration of the calcium carbonate particles in the calcium carbonate slurry is equal to or less than about 2.0 wt. %. The soft material can include a polymer, an inorganic hydrogel, or an organic polymeric hydrogel. For example, the soft material can include an organic polymeric hydrogel. In some implementations, the substrate includes a plurality of features, each of the features has a diameter between about 0.5 nm and about 500 nm, between about 1 nm and about 100 nm, or between about 5 nm and about 50 nm. In some implementations, polishing the surface of the substrate coated with the soft material occurs without substantially scratching the surface of the substrate. One or both of the dispersant and the anionic surfactant reduces a zeta potential of the slurry. In some implementations, the zeta potential of the slurry is equal to or less than about −50 mV.

FIG. 13 shows a flow diagram illustrating an example method for manufacturing a calcium carbonate slurry. The method 1300 may be performed with different, fewer, or additional operations.

At block 1310 of the method 1300, a dispersant and an anionic surfactant are mixed into a solution. The solution may have a desired ionic strength. In some implementations, the solution includes one or both of a buffer and water. In some implementations, the dispersant includes sodium polyacrylate, sodium n-silicate, sodium tetrapyrophosphate, sodium hexametaphosphate, sodium polyalluminate, sodium tetraborate, sodium triphosphate, sodium citrate, or combinations thereof, and the anionic surfactant includes sodium dodecyl sulfate (SDS), polysorbate, octylphenol ethoxylate, or combinations thereof.

At block 1320 of the method 1300, a plurality of calcium carbonate particles are added in the solution to form a slurry, where a concentration of the calcium carbonate particles in the slurry is equal to or less than about 2.0 wt. %. In some implementations, the concentration of the calcium carbonate particles in the slurry is between about 0.05 wt. % and about 1.0 wt. %. The plurality of calcium carbonate particles may be suspended in the solution. The zeta potential of the slurry can be equal to or less than about −30 mV, equal to or less than about −40 mV, equal to or less than about −50 mV, or equal to or less than about −60 mV. For example, the zeta potential of the slurry is equal to or less than about −50 mV. An average diameter of the plurality of calcium carbonate particles can be relatively small, where the average diameter can be equal to or less than about 5 μm, between about 10 nm and about 3 μm, between about 30 nm and about 2 μm, between about 300 nm and about 2 μm, or between about 500 nm and about 1 μm. In some implementations, less than about 5% of a total number of the calcium carbonate particles has a diameter greater than about 4 μm.

In some implementations, at block 1330 of the method 1300, the plurality of calcium carbonate particles are optionally mixed over time to maintain suspension of the calcium carbonate particles in the solution. In some implementations, the plurality of calcium carbonate particles may be suspended in the solution for at least six days. In some implementations, the plurality of calcium carbonate particles may be mixed using one or more of a magnetic stir bar, impeller type mixer, diaphragm pump, slurry pump, peristaltic pump, and high pressure pump.

A composition can be formulated that includes a stable calcium carbonate slurry, where the slurry includes a plurality of calcium carbonate particles suspended in a solution, the solution including a dispersant and a surfactant. The concentration of the plurality of calcium carbonate particles in the slurry is relatively low, such as equal to or less than about 5.0 wt. %, equal to or less than about 2.0 wt. %, or between about 0.05 wt. % and about 1.0 wt. %. An average diameter of the plurality of calcium carbonate particles can be relatively small, where the average diameter can be equal to or less than about 5 μm, between about 10 nm and about 3 μm, between about 30 nm and about 2 μm, between about 300 nm and about 2 μm, or between about 500 nm and about 1 μm. In some implementations, less than about 5% of a total number of the calcium carbonate particles has a diameter greater than about 4 μm. The dispersant and the surfactant can be configured to reduce a zeta potential of the slurry. In some implementations, the zeta potential of the slurry can be equal to or less than about −30 mV, equal to or less than about −40 mV, equal to or less than about −50 mV, or equal to or less than about −60 mV. In some implementations, a concentration of the dispersant in the slurry is between about 0.1 wt. % and about 0.5 wt. %. The calcium carbonate slurry may be resistant to aggregation and may remain in suspension for a long period of time.

The composition of the calcium carbonate slurry as described above can be implemented in a method of polishing a substrate. In some implementations, the substrate comprises at least partly a soft material or is coated with a soft material. For example, the soft material may include an organic polymeric hydrogel. In some implementations, the substrate can include a plurality of features, where each of the features has a diameter between about 0.5 nm and about 500 nm, between about 1 nm and about 100 nm, or between about 5 nm and about 50 nm. Polishing the substrate with the soft material or coated with the soft material can occur without substantially scratching the substrate. In some implementations, the method further includes mixing, prior to polishing the substrate, the plurality of calcium carbonate particles in the solution with the dispersant and the anionic surfactant using one or more of a magnetic stir bar, impeller type mixer, diaphragm pump, slurry pump, peristaltic pump, and high pressure pump. As used in this disclosure, the terms "comprise," "comprising", "include," and "including," and the like are to be construed in an inclusive sense as opposed to an exclusive or exhaustive sense It should be appreciated that all combinations of the foregoing concepts (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. For the sake of brevity, many of those permutations and combinations will not be discussed and/or illustrated separately herein.

What is claimed is:

1. A method, comprising:
   polishing a polyacrylamide hydrogel from a portion of a surface of a substrate with a calcium carbonate slurry without substantially scratching the surface of the substrate, wherein the calcium carbonate slurry comprises a dispersant, a surfactant, and a plurality of calcium carbonate particles suspended in a solution, wherein the dispersant includes sodium polyacrylate, sodium n-silicate, sodium tetrapyrophosphate, sodium hexametaphosphate, sodium polyalluminate, sodium tetraborate, sodium triphosphate, sodium citrate, or combinations thereof, and wherein the surfactant includes sodium dodecyl sulfate (SDS), polysorbate, octylphenol ethoxylate, or combinations thereof.

2. The method of claim 1, wherein a concentration of the calcium carbonate particles in the calcium carbonate slurry is equal to or less than about 2.0 wt. %.

3. The method of claim 1, further comprising:
   mixing, prior to polishing the polyacrylamide hydrogel from the portion of the substrate, the plurality of calcium carbonate particles in the solution with the dispersant and the surfactant using one or more of a magnetic stir bar, impeller type mixer, diaphragm pump, slurry pump, peristaltic pump, and high pressure pump.

4. The method of claim 1, wherein the substrate includes a plurality of features, each of the features having a diameter between about 1 nm and about 100 nm.

5. The method of claim 1, wherein one or both of the dispersant and the surfactant reduces a zeta potential of the slurry.

6. The method of claim 1, wherein a zeta potential of the slurry is equal to or less than −50 mV.

7. The method of claim 1, wherein an average diameter of the plurality of calcium carbonate particles is between about 10 nm and about 3 µm.

8. The method of claim 1, wherein a concentration of the dispersant is between about 0.1 wt. % and about 0.5 wt. % of the slurry.

9. A method, comprising:
   polishing a polyacrylamide hydrogel from a portion of a surface of a substrate with a calcium carbonate slurry without substantially scratching the surface of the substrate, wherein the calcium carbonate slurry comprises a plurality of calcium carbonate particles suspended in a solution, wherein the solution consists of i) water, a buffer, or combinations thereof; ii) a dispersant, where the dispersant is selected from the group consisting of sodium polyacrylate, sodium n-silicate, sodium tetrapyrophosphate, sodium hexametaphosphate, sodium polyalluminate, sodium tetraborate, sodium triphosphate, sodium citrate, and combinations thereof; iii) a surfactant, where the surfactant is selected from the group consisting of sodium dodecyl sulfate (SDS), polysorbate, octylphenol ethoxylate, or combinations thereof; and iv) an optional chelating agent.

* * * * *